US007688655B2

(12) United States Patent
Takai

(10) Patent No.: US 7,688,655 B2
(45) **Date of Patent: *Mar. 30, 2010**

(54) SEMICONDUCTOR MEMORY DEVICE AND TEST METHOD THEREFOR

(75) Inventor: Yasuhiro Takai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/747,552

(22) Filed: May 11, 2007

(65) Prior Publication Data

US 2007/0206430 A1 Sep. 6, 2007

Related U.S. Application Data

(62) Division of application No. 11/221,721, filed on Sep. 9, 2005, now Pat. No. 7,230,870.

(30) Foreign Application Priority Data

Sep. 10, 2004 (JP) ............................. 2004-264231

(51) Int. Cl.
*G11C 29/00* (2006.01)

(52) U.S. Cl. ........................ 365/200; 365/222; 365/201

(58) Field of Classification Search ................. 365/200, 365/222, 201, 230.06, 185.14, 191, 230.03, 365/189.07
See application file for complete search history.

(56) References Cited

U.S. PATENT DOCUMENTS 4,736,344 A * 4/1988 Yanagisawa ................ 365/222
6,141,278 A 10/2000 Nagase
6,388,941 B2 * 5/2002 Otori et al. ............. 365/230.08
6,590,815 B2 7/2003 Mine
6,636,449 B2 * 10/2003 Matsuzaki .................. 365/222
6,707,730 B2 * 3/2004 Mori et al. .................. 365/200
6,944,074 B2 * 9/2005 Chung et al. ................ 365/200
7,054,223 B2 * 5/2006 Takahashi et al. ........... 365/154
7,372,749 B2 * 5/2008 Poechmueller .............. 365/200

FOREIGN PATENT DOCUMENTS

JP 4-10297 A 1/1992
JP 7-182858 A 7/1995
JP 11-39861 A 2/1999

* cited by examiner

*Primary Examiner*—Dang T Nguyen
(74) *Attorney, Agent, or Firm*—Sughrue Mion, PLLC

(57) ABSTRACT

Disclosed is a semiconductor memory device, in which the refresh period of a fail cell or cells is set so as to be shorter than that of the normal cells, comprises a control circuit for exercising control in such a manner that, if, when refreshing the cell of a first address, generated responsive to a refresh command, with an input control signal being of a first value, a second address, differing as to the value of a predetermined bit from the first address, is determined to correspond to a fail cell, based on the information ore-programmed in a refresh redundant ROM, the cell of the second address is refreshed, and also in such a manner that, if, with the input control signal of a second value, the second address, differing as to the value of a predetermined bit from the first address, is determined to correspond to a fail cell, based on the predetermined information, only the cell of the second address is refreshed, without refreshing the cell of the first address, generated responsive to the refresh command.

16 Claims, 8 Drawing Sheets

COMPARATIVE EXAMPLE

COMPARATIVE EXAMPLE

COMPARATIVE EXAMPLE

SEMICONDUCTOR MEMORY DEVICE AND TEST METHOD THEREFOR

FIELD OF THE INVENTION

This invention relates to a semiconductor memory device and a test method therefor. More particularly, it relates to a semiconductor memory device, and a test method therefor, in which, in relieving fail cells, the refresh period for the fail cells, that cannot be relieved by row redundancy or column redundancy, is made shorter than the refresh period of normal cells, and which thereby lend themselves to shortening the test time and to improving the production yield.

BACKGROUND OF THE INVENTION

FIG. 8 shows the configuration of a conventional semiconductor memory device. In FIG. 8, a memory cell array 1 forms a memory array divided into a plural number of segments as relief units (redundancy units). In FIG. 8, the ROW and the COLUMN of the memory cell array are divided into four segments and into two segments, respectively. A ROW address, generated by a peripheral circuit 2, is supplied to a switch (multiplexer) 3, an output of which is supplied to a ROW pre-decoder 4 and to a redundancy X-decoder (XDEC) 5. When a command for write or read access to or from a memory cell is entered, a ROW address, as an access address, supplied from outside, is selected by the switch 3 and thence transmitted to a ROW pre-decoder 4 and to the redundancy XDEC 5.

When a CBR (auto) refresh command is entered, an internal ROW address (refresh address), counted up in a CBR (Cas Before Ras) counter 6, is selected by the switch 3, based on the CBR signal, generated in accordance with the refresh signal, and thence transmitted to the ROW pre-decoder 4 and to the redundancy XDEC 5.

Outputs X3 to X12 of the ROW pre-decoder 4 are supplied to an X-decoder 7 (XDEC) to select a main word line, whilst outputs X0 to X2 are supplied to the memory cell array 1 for use for selecting a sub-word line provided with a ratio of 8 per main word line.

The count value of the CBR counter 6 is counted up each time a CBR (auto) refresh command is entered.

When an output signal (internal ROW address) of the switch 3, supplied to the redundancy XDEC 5, coincides with a ROW redundancy address, programmed in the redundancy XDEC 5, a redundancy main word line, decoded by the redundancy XDEC 5, is selected in place of a main word line decoded by the X-decoder 7. Similarly, when a COLUMN address, supplied to a redundancy YDEC 18, coincides with a redundancy COLUMN address, programmed in the redundancy YDEC 18, the selected COLUMN line, decoded by a YDEC 9, is controlled to be not selected, whilst a selected redundancy COLUMN line, decoded by the redundancy YDEC 18, is selected. In FIG. 8, the input/output circuit 12 is used for writing and reading data to and from the cell array 1.

In a conventional process for relieving fail cells in a conventional semiconductor memory device, a memory cell array forms an array divided into a plural number of segments as relief units. When an output signal of the switch 3, supplied to the redundancy XDEC 5 (internal ROW address signal) of FIG. 8, coincides with a ROW redundancy address, as programmed in the redundancy XDEC 5, the main word line, decoded by the XDEC 7, is non-selected, while a redundancy main word line, decoded by the redundancy XDEC 5, is selected.

If, in the conventional relieving process for fail cells in the conventional semiconductor memory device, a redundancy circuit is already used up in a given segment, the semiconductor memory device cannot be relieved, because the redundancy circuit has already been used up, even though there are left usable redundancy circuits in the other segments. Thus, there arises the necessity for providing more redundancy cells, thus increasing the cost of a chip.

For example, there is disclosed in Patent Document 1 a semiconductor memory device which performs refreshing for specified cells having poor refresh characteristics more frequently than other cells to relieve the specified cell to reduce the chip area as well as to reduce the costs.

[Patent Document 1]

JP Patent Kokai Publication No. JP-A-4-10297 (from page 3 right upper column line 4 to page 4 right upper column line 12 and FIGS. 1 to 3)

SUMMARY OF THE DISCLOSURE

The present inventor has directed attention to the fact that the fail cell suffers from poor refresh characteristics and that many fail cells may be relieved by improving the refresh characteristics thereof and by carrying out refreshing in a shorter period than with normal cells. Thus, the present inventor has devised a device and a method with which fail cells may be relieved, normal cell and fail cells may be prevented from being mistaken for each other, at the time of testing, and with which testing may be carried out accurately with a shorter test time.

Accordingly, it is an object of the present invention to provide a semiconductor memory device, and a test method therefor, according to which the product yield may be improved, the test time may be made shorter as accuracy of test is maintained, and product cost may be suppressed.

The above and other objects, are attained by a semiconductor memory device in accordance with one aspect of the present invention including a plurality of cells in need of refreshing for data retention, in which the refresh period for a fail cell with regard to refreshing is made shorter than the refresh period for normal cells, and in which, if, in refreshing a cell of a first address, generated responsive to a refresh command, a second address, which is different from said first address as to the value of a predetermined bit, is determined, based on the pre-programmed information, as corresponding to a fail cell, the cell of said second address is refreshed. The semiconductor memory device comprises control means for exercising control so that, if the second address, different from said first address generated responsive to a refresh command as to the value of a predetermined bit, is determined, based on said pre-programmed information, as corresponding to a fail cell, the cell of said second address only is refreshed without refreshing the cell of the first address.

A semiconductor memory device in another aspect of the present invention includes a plurality of cells in need of refreshing for data retention, in which the refresh period of a cell failed as to refreshing is made shorter than the refresh period for normal cells. The semiconductor memory device comprises control means for exercising control so that, if an input control signal is of a first value, and if, in refreshing a cell of a first address, generated from a refresh address generating circuit, a second address, different from the first address as to the value of a predetermined bit, is determined, based on the pre-programmed information, as corresponding to a fail cell, the cell of the second address is refreshed as well. The control means also exercises control so that, if the input control signal is of a second value, and if a second address, different from the first address, generated by the refresh address generating circuit, as to the value of a predetermined bit, is determined, based on the pre-programmed information, as corresponding to a fail cell, the cell of the second address only is refreshed without refreshing the cell of the first address.

The first and second addresses may differ from each other as to the most significant bit in a counter generating the refresh address.

A test method for a semiconductor memory device in yet another aspect of the present invention includes a plurality of cells in need of refreshing for data retention, in which, in writing data in the cells, reading out data so written from the cells after lapse of a preset time and in comparing the data read out with expected value for determining pass or fail of the semiconductor memory device under test, the refresh period for a fail cell or cells is made shorter than the refresh period of normal cells. The test method comprises (A) a first step of refreshing if, in refreshing a cell of a first address generated responsive to a refresh command, a second address, different from the first address as to the value of a predetermined bit, is determined, based on the pre-programmed information, as corresponding to a fail cell, a cell of the second address as well, and refreshing a cell array, and (B) a second step of refreshing, if the second address, different from the first address, generated responsive to a cell refresh command, as to the value of a predetermined bit, is determined, based on the pre-programmed information, as corresponding to a fail cell, only the second cell, after the end of the first step, without refreshing the cell of the first address.

The meritorious effects of the present invention are summarized as follows.

According to the present invention, if the control signal indicates blank shot refresh, the first address is not refreshed and, if the second address, different from the first address as to a the value of a predetermined bit, is determined, based on the pre-programmed information, as corresponding to a fail cell, only the second address is refreshed. By so doing, the fail cell may be refreshed with a short period, the normal cell may be refreshed with a normal period longer than the short period, and pass and fail products may be sorted accurately, while the test time may be made shorter to suppress or lower test costs. It is noted that the shorter test time is conductive to a lower product cost.

PREFERRED EMBODIMENTS OF THE INVENTION

A mode of practicing the present invention will now be described in detail with reference to the drawings. The semiconductor memory device according to the present invention, is directed to a dynamic semiconductor memory, in which the refresh period of the fail cell is set so as to be shorter than the refresh period of the normal cells. For example, the refresh period of the cells, connected to the word line W(2) of FIG. 1 (see also FIGS. 3 and 4), with the refresh capability e.g. for data retention time inferior to that of the normal cell, is set so as to be shorter than the refresh period of the normal cell. If an input refresh control signal (termed a blank shot control signal) is in inactive state, and if, in refreshing a cell of a first address (ROW address), a second address, different from the first address as to the value of a predetermined bit, is determined, based on the information pre-programmed in e.g. a fuse ROM, as corresponding to a fail cell, the cell of the second address is refreshed simultaneously with the cell of the first address. On the contrary, if the blank shot control signal is of a second value, and if the second address, different from the first address as to the value of a predetermined bit, is determined, based on the information pre-programmed e.g. in a fuse ROM, as corresponding to a fail cell, the cell of the second address only is refreshed without refreshing the cell of the first address. Thus, according to the present invention, there is introduced a blank shot control signal for not refreshing the cell specified by the internal ROW address generated by the refresh counter and for refreshing only the cell or cells to be relieved for refresh. This blank shot control signal is activated when a blank shot control signal is entered from e.g. a tester.

In testing of the semiconductor memory device, data are written in the cell array, and burst refresh is carried out for the totality of the word lines (the word line W(2) is refreshed when the word line W(N+2) is refreshed). After waiting for the data retention time, necessary for sorting the fail cell or cells, the blank shot control signal is activated to carry out the blank shot (only for the word line W(2), the fail cell or cells are connected to). The word lines W(1) to W(N+1), selected by the refresh address, are not refreshed and, if the refresh address corresponds to the word line W(N+2), only the word line W(2) is refreshed. After again waiting for the data retention time, to be sorted with the fail cell or cells, burst refresh is carried out. By this test control, the refresh period is set to a short time corresponding to the data retention time for the fail cell or cells, while the normal cell or cells may be tested with the refresh period corresponding to the data retention time for the normal cells. The present invention will now be described with reference to an embodiment.

Embodiment

Figure 1:
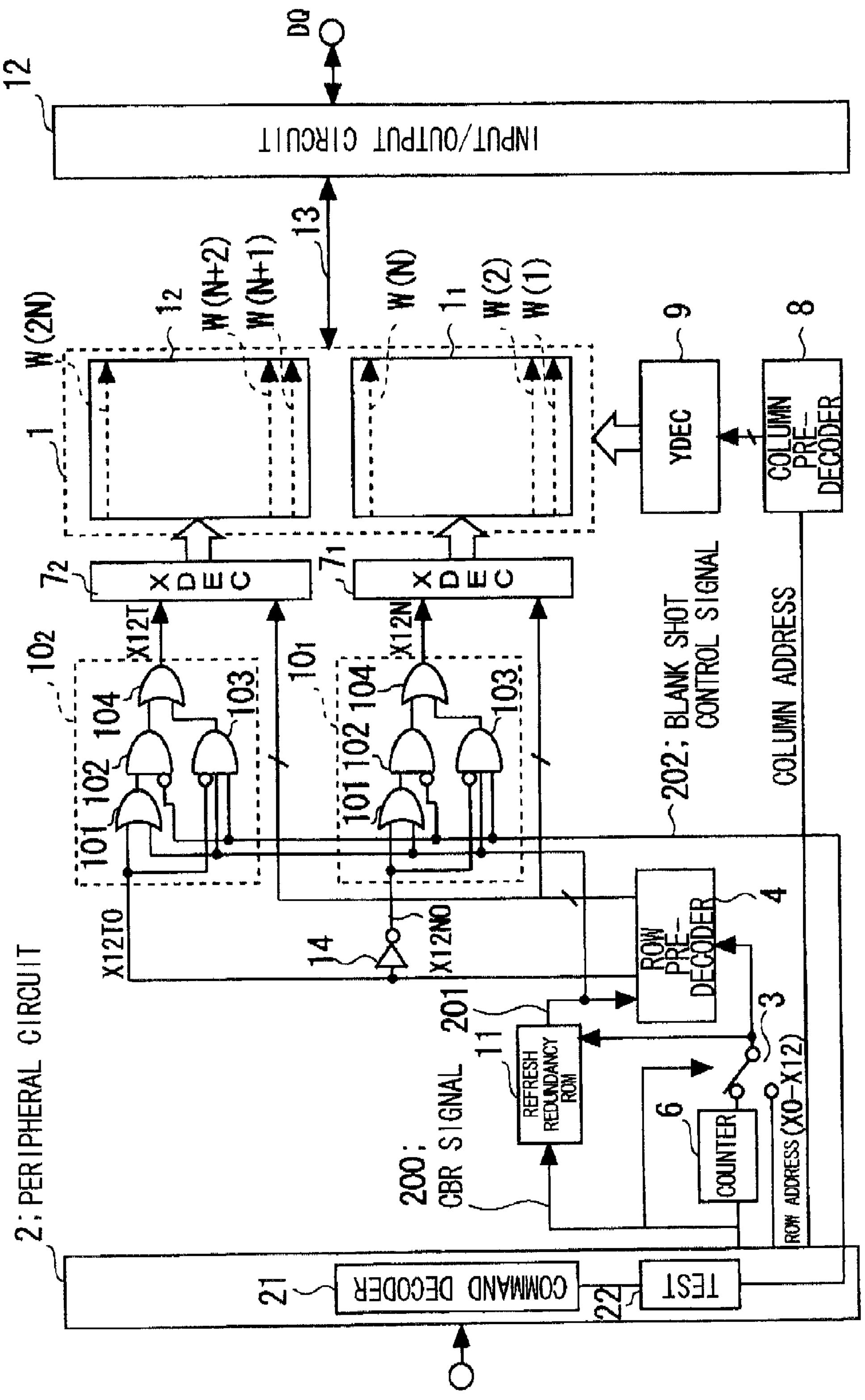
FIG. 1 is a diagram showing a configuration of an embodiment of the present invention.

FIG. 1 shows a configuration according to an embodiment of the present invention. Referring to FIG. 1, a memory cell array 1 comprises cell arrays $\mathbf{1}_1$ and $\mathbf{1}_2$, also termed plates or mats. The cell array $\mathbf{1}_1$ includes N word lines W(1) to W(N), while the cell array $\mathbf{1}_2$ includes N word lines W(N+1) to W(2N). Each cell array includes sense amplifiers, not shown. Meanwhile, there is not shown in FIG. 1 the configuration for ROW redundancy or COLUMN redundancy, such as redundancy XDEC or redundancy YDEC.

A peripheral circuit 2 includes a command decoder 21 and a test circuit 22, in addition to an address register (a register holding address signals), latch circuits for receiving and latching control signals, an internal clock generator, a timing generator for generating a variety of timing signals, a refresh control circuit, and a mode register, these circuits or the register being not shown. The input/output circuit 12 includes an input buffer, connected to a data terminal (DQ), a tri-state buffer (output buffer), a register for latching write data, and a register for latching read data, which is to be output to a data terminal. The input/output circuit is connected to the sense amplifiers of the cell array over an input/output (I/O) line 13.

A counter 6 (CBR counter) is a refresh counter (2N counter), supplied with a CBR signal (refresh control signal) 200 from the peripheral circuit 2 to count up a count value. The count value of the counter 6 is output as a refresh address (internal ROW address).

When the CBR signal 200 is active, the switch (multiplexer) 3 selects and sends out an output signal of the counter 6 and, when the CBR signal 200 is inactive, the switch 3 selects and outputs a ROW address (access address), supplied to an external address terminal. The CBR signal 200 is supplied to a refresh redundancy ROM 11. When the CBR signal 200 is active (at a high level), the refresh redundancy ROM 11 retrieves whether or not fuses selected by the address have been cut.

The refresh redundancy ROM 11 is a fuse ROM which has stored the ROW addresses of fail cells to be relieved as to refreshing. When an input ROW address coincides with a ROW address of one of programmed fail cells, in the present embodiment, in a ROW address of the fail cell plus N, the refresh redundancy ROM 11 outputs a coincidence signal ('refresh relief signal') 201 as a signal in the activated state (at a high-level). The fail cells, as a subject of relief as to refreshing, are detected e.g. by a wafer test (probing test) and the fuse of an address corresponding to a relevant ROW address is cut e.g. by laser. The refresh redundancy ROM 11 sends out an output signal 201 of a logic value corresponding to blow/non-blow of the fuse of the cell selected by the input address.

The ROW pre-decoder 4 is supplied with and pre-decodes ROW addresses X0 to X12 from the switch 3, and sends pre-decoded results to XDECs $\mathbf{7}_1$ and $\mathbf{7}_2$. The ROW pre-decoder 4 sends the most significant bit (X12) of the input ROW address as a most significant bit signal X12T0 to a control circuit 102. A signal X12T0, output from the ROW pre-decoder 4, and inverted by an inverter 14, is sent as an inverted signal X12N0 to a control circuit $\mathbf{10}_1$.

The control circuit 10, and the control circuit $\mathbf{10}_2$ generate signals X12N and X12T, controlling the selection of the cell arrays $\mathbf{1}_1$ and $\mathbf{1}_2$, respectively, and each include a two-input OR circuit 101, a two-input AND circuit 102, a three-input AND circuit 103 and a two-input OR circuit 104.

In the control circuit 101, the two-input OR circuit 101 receives the signal X12N0 and the coincidence signal 201 from the refresh redundancy ROM 11, while the two-input AND circuit 102 receives an output of the two-input OR circuit 101 and a blank shot control signal 202 (inverted signal). The three-input AND circuit 103 receives an inverted signal of the signal X12N0, the coincidence signal 201 and the blank shot control signal 202, while the two-input OR circuit 104 receives outputs of the AND circuits 102 and 103 to send out a signal X12N to the XDEC $\mathbf{7}_1$ and to the cell array $\mathbf{1}_1$. When the signal X12N is in an inactive state, the cell array $\mathbf{1}_1$ is not selected. For example, the selected word line is not activated, e.g. a sense amplifier is not activated and hence the refresh operation for the selected word line is not carried out.

In the control circuit $\mathbf{10}_2$, the two-input OR circuit 101 receives the signal X12T0 and the coincidence signal 201 from the refresh redundancy ROM 11, while the two-input AND circuit 102 receives an output of the two-input OR circuit 101 and the blank shot control signal 202 (inverted signal). The three-input AND circuit 103 receives an inverted signal of the signal X12T0, the coincidence signal 201 and the blank shot control signal 202, while the two-input OR circuit 104 receives outputs of the AND circuits 102 and 103 to send out a signal X12T to the XDEC 72 and to the cell array $\mathbf{1}_2$. When the signal X12T is in an inactive state, the cell array $\mathbf{1}_2$ is not selected. For example, the selected word line is not activated, e.g. the sense amplifier is not activated and hence refresh for the selected word line is not carried out.

The XDECs $\mathbf{7}_1$ and $\mathbf{7}_2$ decode address signals from the ROW pre-decoder 4 to drive the word line selected to a high potential for a predetermined time period by a word driver, not shown.

A COLUMN pre-decoder 8 pre-decodes a COLUMN address and sends the decoded result to the YDEC 9. This YDEC 9 decodes the pre-decoded result and turns on a selected Y-switch, not shown, for connecting a sense amplifier, not shown, to the I/O line 13.

Under control from the command decoder 21, supplied with a blank shot command, the test circuit 22 activates, that is, sets to a high level, the blank shot control signal 202 during the refresh operation. That is, according to the present invention, a blank shot command, refreshing only cells as a subject of refresh relief, without refreshing the cell specified by the generated refresh address (internal ROW address), is introduced and used for testing. The test circuit 22 activates (sets to a high level) the blank shot control signal 202, under a command for blank shot from the command decoder 21.

Figure 2:
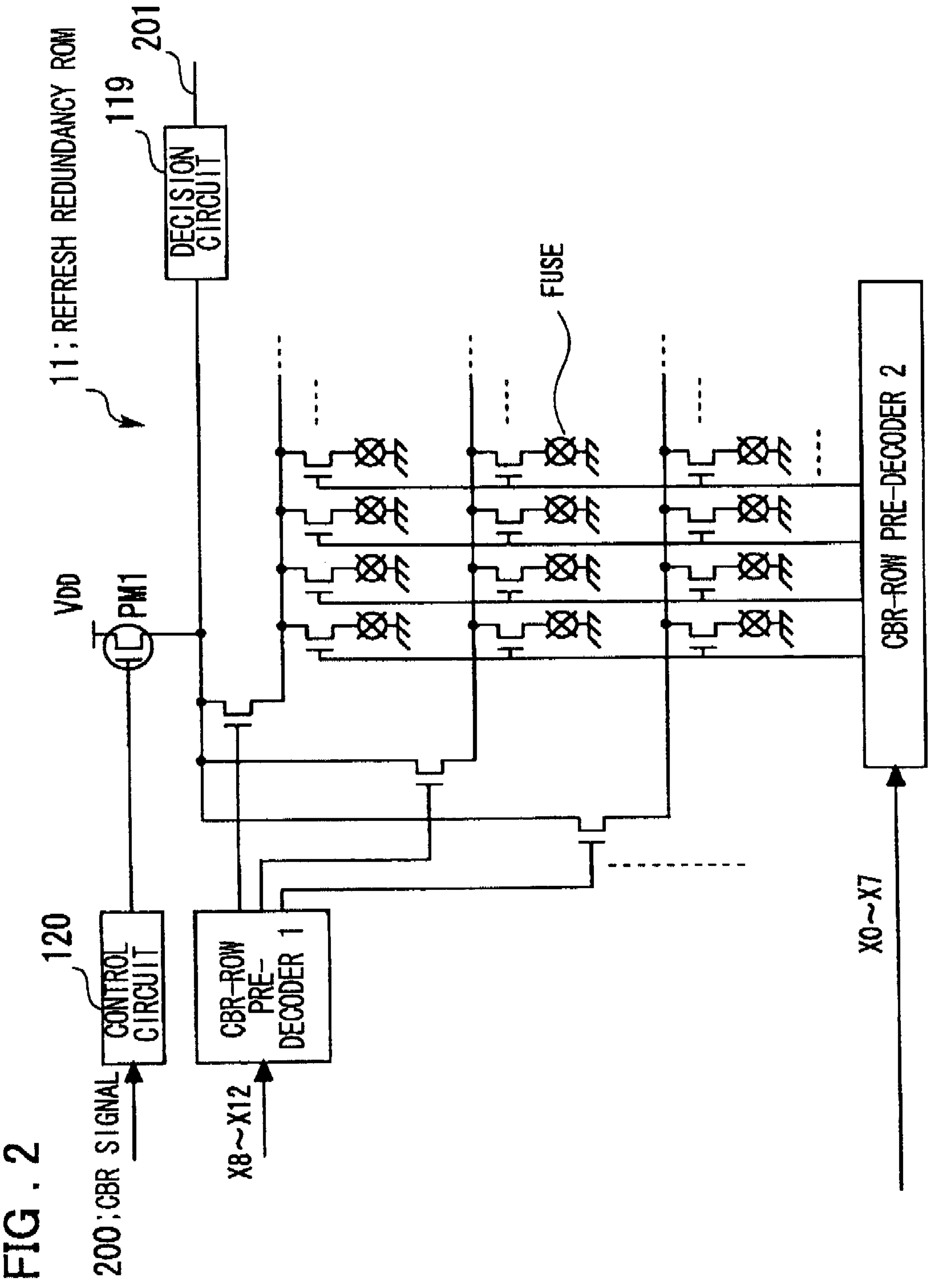
FIG. 2 is a diagram showing a configuration of a refresh redundancy ROM according to the embodiment of the present invention.

FIG. 2 shows an illustrative configuration of the refresh redundancy ROM 11. It is as a matter of course noted the present invention is not limited to the refresh redundancy ROM structure shown in FIG. 2. The ROW pre-decoder decodes X8 to X12 and X0 to X7 of the ROW address X0 to X12, with a first CBR-ROW pre-decoder 1 and with a second CBR-ROW pre-decoder 2, respectively. In case the result of decoding indicates that the fuse of a selected cell has been blown, that is, the selected cell is a fail cell, a high level signal is supplied to a decision circuit 119, which decision circuit 119 then outputs a high-level coincidence signal 201. If conversely the result of decoding indicates that the fuse of the selected cell has not been blown, that is, the selected cell is not a fail cell, a low level signal is supplied to the decision circuit 119, which decision circuit 119 then outputs a low-level coincidence signal 201.

Meanwhile, in the present embodiment, in case a fail cell is connected to a word line W(2), the refresh redundancy ROM 11 sets the coincidence signal 201 to a high level for a ROW address N+2 from the counter 6. It is noted that, when the CBR signal 200 is inactive state, a control circuit 120 sets the gate of a P-channel MOS transistor PM1 to low level to pre-charge the contact of the fuse ROM.

In the configuration shown in FIG. 1, during read/write access, other than the refresh operation, the coincidence signal 201 and the blank shot control signal 202 are inactivated (at a low level). In the control circuit $\mathbf{10}_1$, the output of the AND circuit 103 is fixed at a low level. When the signal X12N0 is high, the output of the OR circuit 101 goes high, and the cell array $\mathbf{1}_1$ is selected by the signal X12N, which is at a high level, to effect read/write access. On the other hand, in the control circuit $\mathbf{10}_2$, the output of the AND circuit 103 is fixed at a low level. When the signal X12T0 is high, the output of the OR circuit 101 goes high, and the cell array 12 is selected by the signal X12T, which is at a high level, to effect read/write access.

Figure 3:
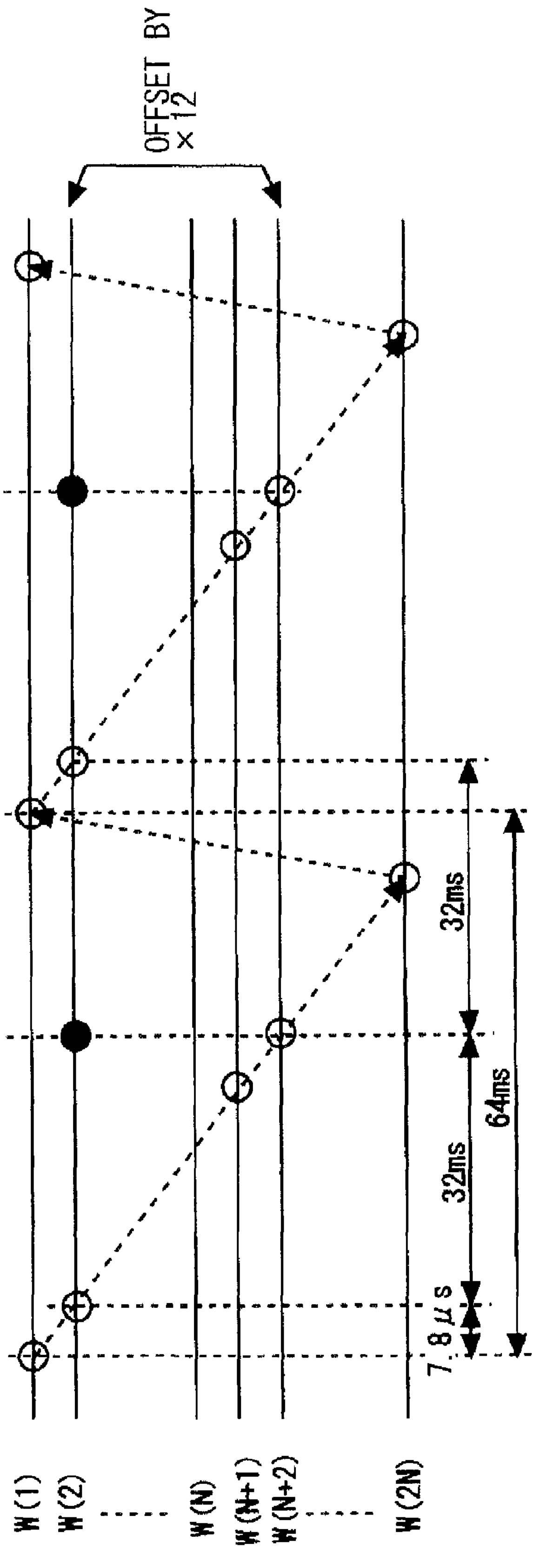
FIG. 3 is a diagram illustrating the normal refresh operation according to the embodiment of the present invention.

FIG. 3 illustrates the distributed refresh operation, during the normal operation, of an embodiment of the present invention. It is now assumed that, in FIG. 1, a word line W(2) of the cell array includes a cell or cells suffering from refresh failure and that this word line is to be relieved by carrying out refresh at a refresh period one-half of the refresh period for the normal cell. The memory cell array 1 includes 8K (1K being 1024) word lines (4K word lines+4K word lines), with the refresh period of the normal cells being 64 ms and with that of the fail cell being 32 ms. The refresh interval from one word line to the next is 7.8 μs. Referring to FIG. 3, refresh for the memory cell array for 8K (=2N=8192) lines is carried out with the refresh period of 64 ms.

First, in refreshing the word line W(2), the coincidence signal 201 is at a low level, the signal X12N0 is at a high level, the signal X12T0 is at a low level and, in the control circuit $\mathbf{10}_1$, the blank shot control signal 202 is at a low level. Hence, the output of the AND circuit 102 is high and the signal X12N is high to effect refresh of the word line W(2). The signal X12T is at a low level. Refresh is carried out as data of a plurality of cells connected to the selected word line are read out on respective bit lines and amplified by associated sense amplifiers, with the so amplified data being then written back respectively into the plurality of cells. The same operations occur up to the ROW address from the counter 6 of W(N+1).

When the output of the counter 6 (internal ROW address) is N+2, the word line W(2) is the world line connected to the fail cell, and the coincidence signal 201 of a high level is output from the refresh redundancy ROM 11. Since the outputs of the OR circuits 101 of the control circuits $\mathbf{10}_1$ and $\mathbf{10}_2$ are both high, and the blank shot control signal 202 is low, the output of the AND circuit 102 goes high to activate both the signals X12N and X12T. The cells connected to the word line W(2) of the cell array $\mathbf{1}_1$ (indicated by black circles) and the cells connected to the word line W(N+2) of the cell array $\mathbf{1}_2$(indicated by outline circles) are refreshed. When the cell array of the 8K word lines is refreshed (64 ms), refresh is carried out again, beginning from the word line W(1). The refresh period for the cells (black circles) of the word line W(2) is 32 ms, with the refresh period for the other cells being 64 ms, whereby fail cells may be relieved.

Referring to FIG. 1, the control circuit $\mathbf{10}_1$ and the control circuit $\mathbf{10}_2$ in case the blank shot control signal 202 is inactivated may be said to be equivalent to circuits effectively provided only with the OR circuits 101, with the outputs of the OR circuits 101 being X12N and X12T.

Figure 4:
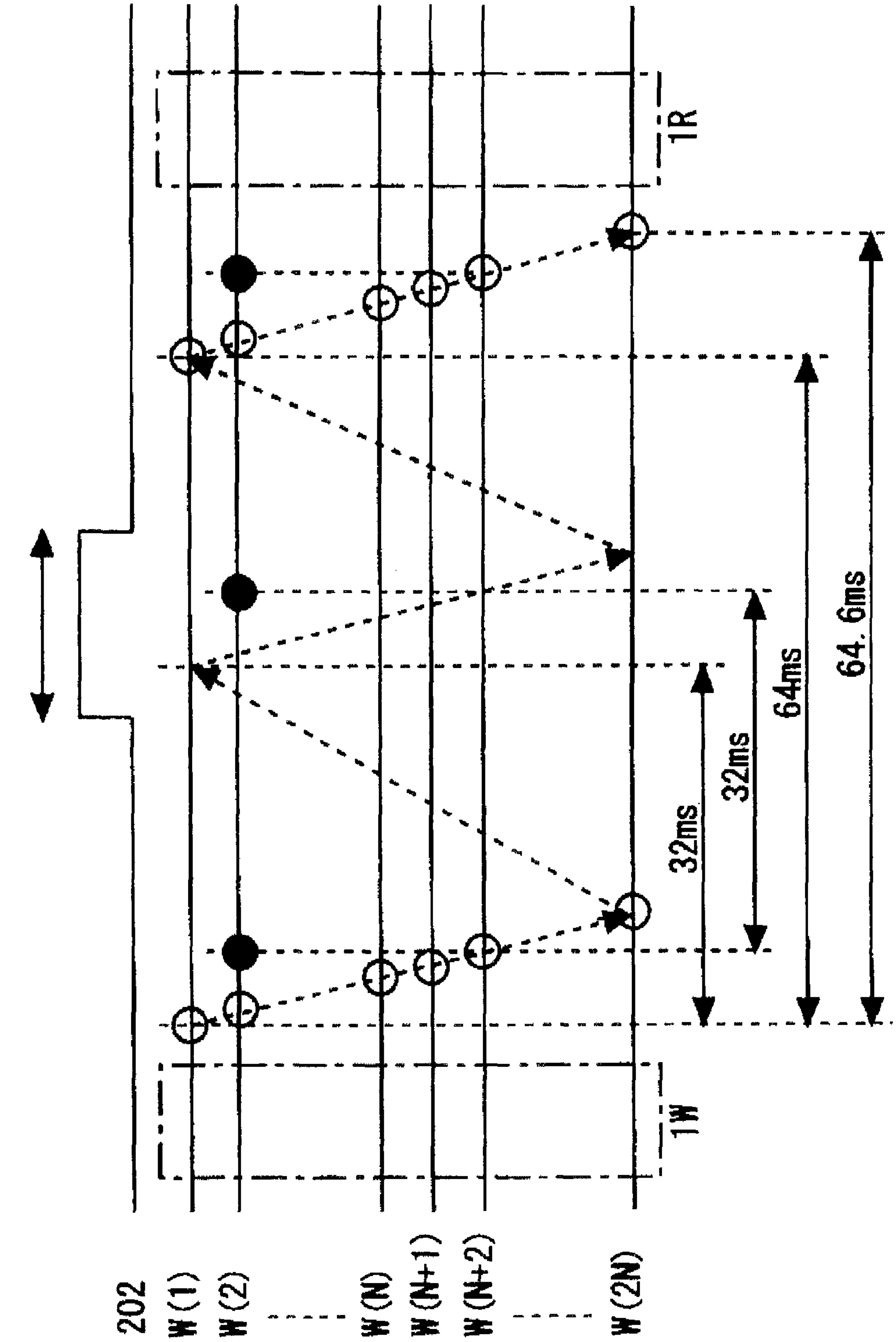
FIG. 4 is a diagram illustrating the refresh operation for test time according to the embodiment of the present invention.

FIG. 4 is a diagram for illustrating the test operation of an embodiment of the present invention. Specifically, FIG. 4 shows a test sequence in which 1 is written in a cell array, there is provided a refresh period, and data written in the cell is then read out therefrom and compared to an expected value 1 by a comparator (comparator of a pin electronics card of a memory tester).

After writing data 1, burst refresh is carried out every 75 ns. First, after writing data 1 in the cell array, (see '1W' of FIG. 4), burst refresh is carried out for the word lines W(1) to W(2N). In this case, when refreshing the word line W(N+2), the word line W(2) (word line of the fail cell or cells) of the other cell array is refreshed simultaneously, based on the output of the refresh redundancy ROM. Refresh of the cell arrays of the totality of 8K word lines comes to a close in 75 ns×8K=0.6 ms. Responsive to the end of the refresh, and after 32 ms as from the start of the refresh, the blank shot control signal 202, as a high level signal, is output from the test circuit 22, when the blank shot command, for example, is supplied from the memory tester, more specifically, each time the blank shot command is entered. That is, the counter 6 counts up, every 75 ns, by the inputting of the refresh command, and an internal ROW address (refresh address) is generated, however, since the blank shot control signal 202 is at a high level, the outputs of the OR circuits 101 of the control circuits $\mathbf{10}_1$ and $\mathbf{10}_2$ are masked by the AND circuit 102.

With the ROW addresses which are associated with the word lines W(1) to W(N), since the signal X12N0 is at a high level, the output of the AND circuit 103 of the control circuit $\mathbf{10}_1$ is fixed at a low level. Hence, the signal X12N is at a low level, so that the cell array $\mathbf{1}_1$ is not selected.

With the ROW addresses which are associated with the word lines W(N+1) to W(2N), since the signal X12T0 is at a high level, the output of the AND circuit 103 of the control circuit $\mathbf{10}_2$ is fixed at a low level. Thus, the signal X12T is at a low level and hence the cell array $\mathbf{1}_2$ is not selected. With the ROW addresses, associated with the word lines W(1) to W(N), the signal X12N0 is at a low level, the coincidence signal 201 from the refresh redundancy ROM 11 is high and, at this time, the blank shot control signal 202 is high, so that the output of the AND circuit 103 of the control circuit $\mathbf{10}_1$ is high, and hence the signal X12N is set to a high level. That is, in the blank shot refresh, the word line W(2) is refreshed, without refreshing the word line W(N+2) corresponding to the ROW address N+2. The remaining word lines are not refreshed.

The time duration of the blank shot refresh from the word line W(1) up to the word line W(2N) is approximately 0.6 ms. The blank shot control signal 202 is kept at a high level during refreshing 2N word lines.

After lapse of 32 ms, corresponding to data retention time of fail cells, as from the start of refresh by the blank shot refresh, burst refresh is again performed. At this time, the word lines W(1) to W(N+1) are sequentially refreshed and, in refreshing the selected word line W(N+2), the word line W(2) is refreshed. After the burst refresh, data are read out from the cell array and compared to the expected value.

For this test, data 0 may be written, in place of 1 W prior to the refresh period, and the data 0 may be read out with IR. Of course, the data 1 or 0 may be written in the memory cell array 1 in accordance with a test pattern such as marching or galloping.

In the present embodiment, the refresh period for the fail cell or cells of the word line W(2) is 32 ms, while the refresh period of the normal cells is 64 ms, and the test may be carried out correctly, as shown in FIG. 4. That is, in the present embodiment, it is possible to avoid mistaken decision of inherently relievable cell or cells as being fail cell or cells, otherwise caused by setting the refresh period for the fail cell or cells during the test to a longer value than the refresh capability, as well as to avoid mistaken decision of a fail cell or cells for good (pass) cell or cells, otherwise caused by shortening the refresh period of the normal cell or cells in keeping with that of the fail cell or cells.

Figure 5:
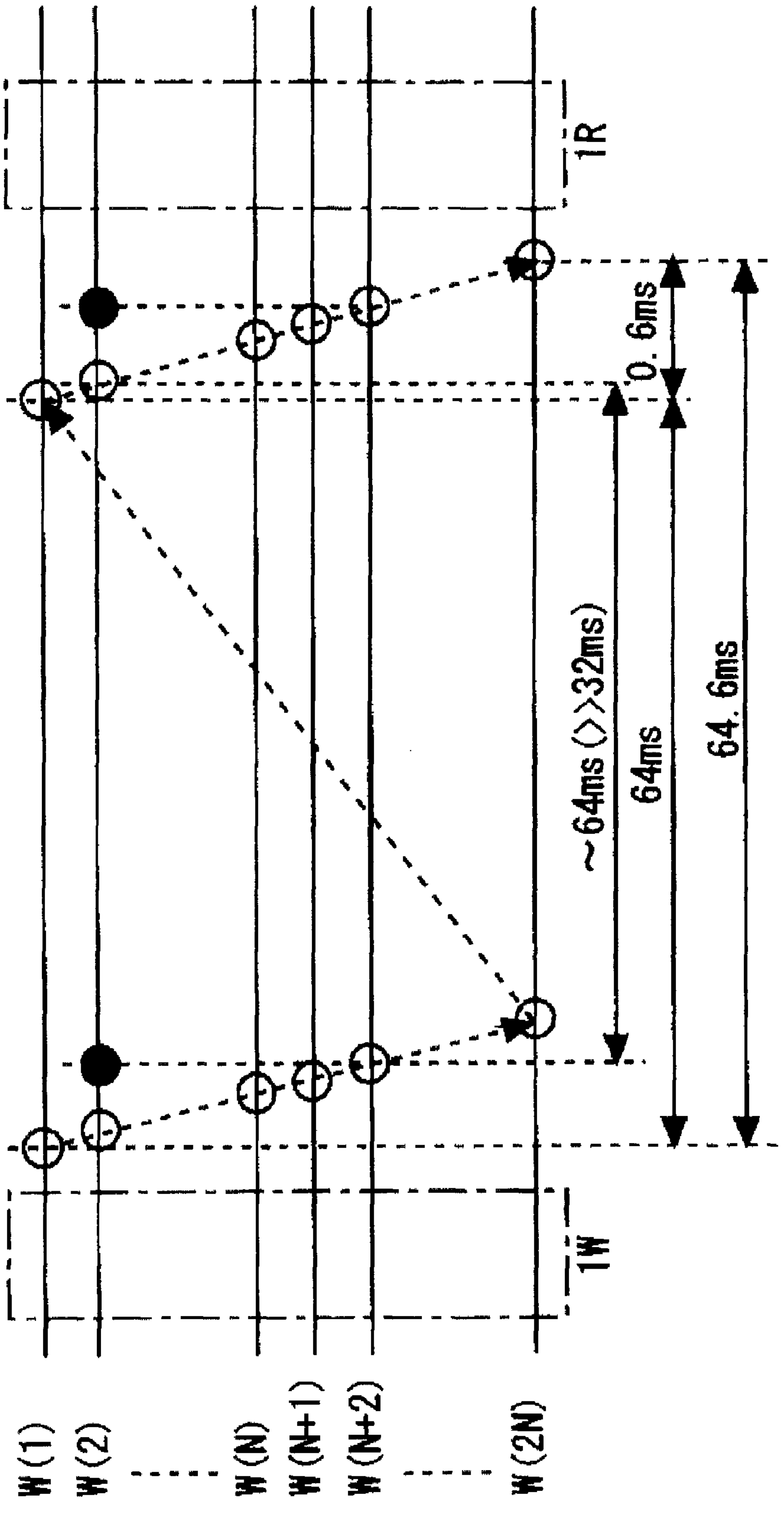
FIG. 5 is a diagram illustrating the refresh operation for test time according to a Comparative Example.

FIG. 5 shows, by way of a Comparative Example of the present invention, the operation in a write-1-refresh-read-1 test, in which a refresh command is entered in 75 ns after 1-write to perform refresh for the word lines W(1) up to W(2N), as the word line W(2) is refreshed at the time of refreshing the word line W(N+2), and in which burst refresh is again performed after lapse of 64 ms as from start of the burst refresh. In this case, the refresh period of the cell or cells of the word line W(2) is 64 ms which is the same as that for the normal cells. Hence, the fail cell or cells may fail, when reading out 1, due e.g. to data retention errors. That is, the cell or cells, which may well be relieved with the use of a shorter refresh period, may be determined to be fail cell or cells.

Figure 6:
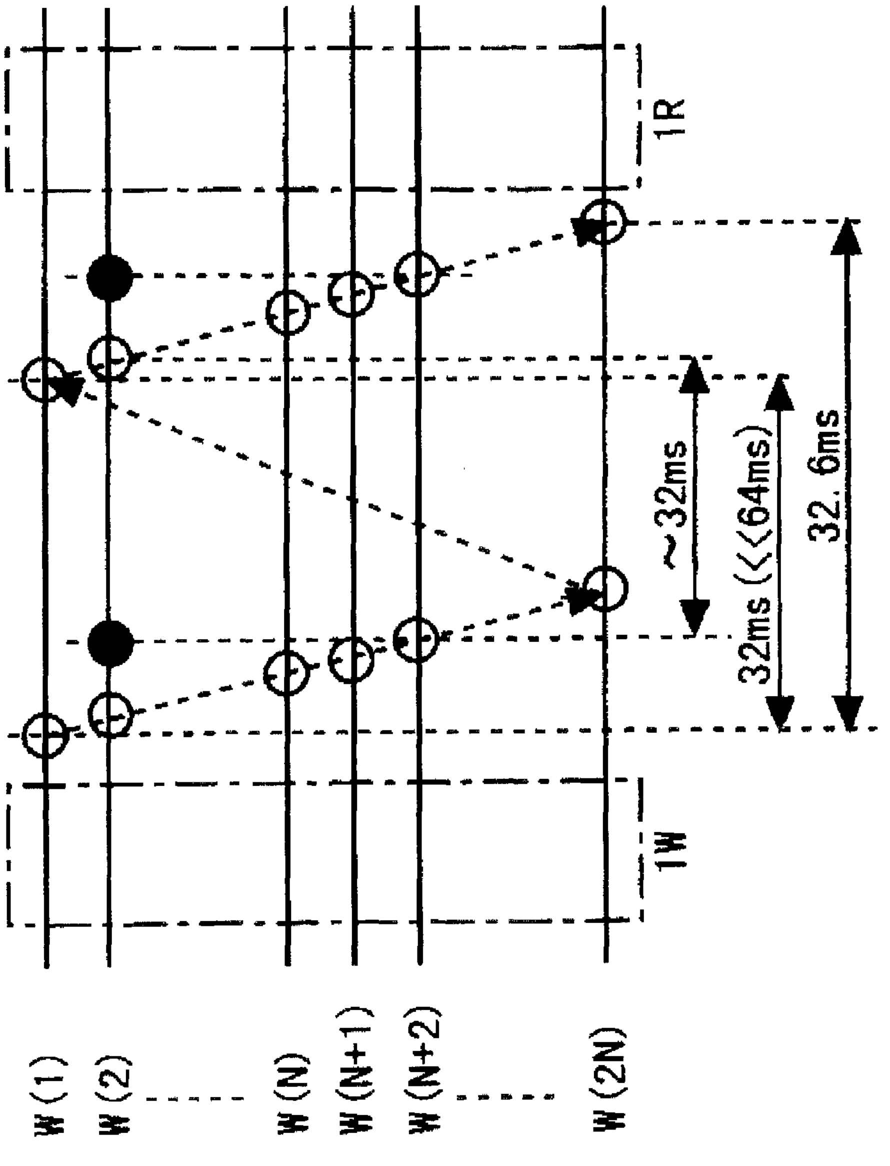
FIG. 6 is a diagram illustrating the refresh operation for test time according to another Comparative Example.

FIG. 6 shows, by way of another Comparative Example of the present invention, the operation in a write-1-refresh-read-1 test, in which a refresh command is entered in 75 ns after 1-write to perform refresh for the word lines W(1) up to W(2N), as the word line W(2) is refreshed at the time of refreshing the word line W(N+2), and in which burst refresh is again performed after lapse of 32 ms as from start of the burst refresh. In this case, the refresh period of the totality of cells is 32 ms, as is that of the fail cell or cells, such that there is a risk that normal cells, inferior in the refresh capability, are determined to be passable cell or cells.

Figure 7:
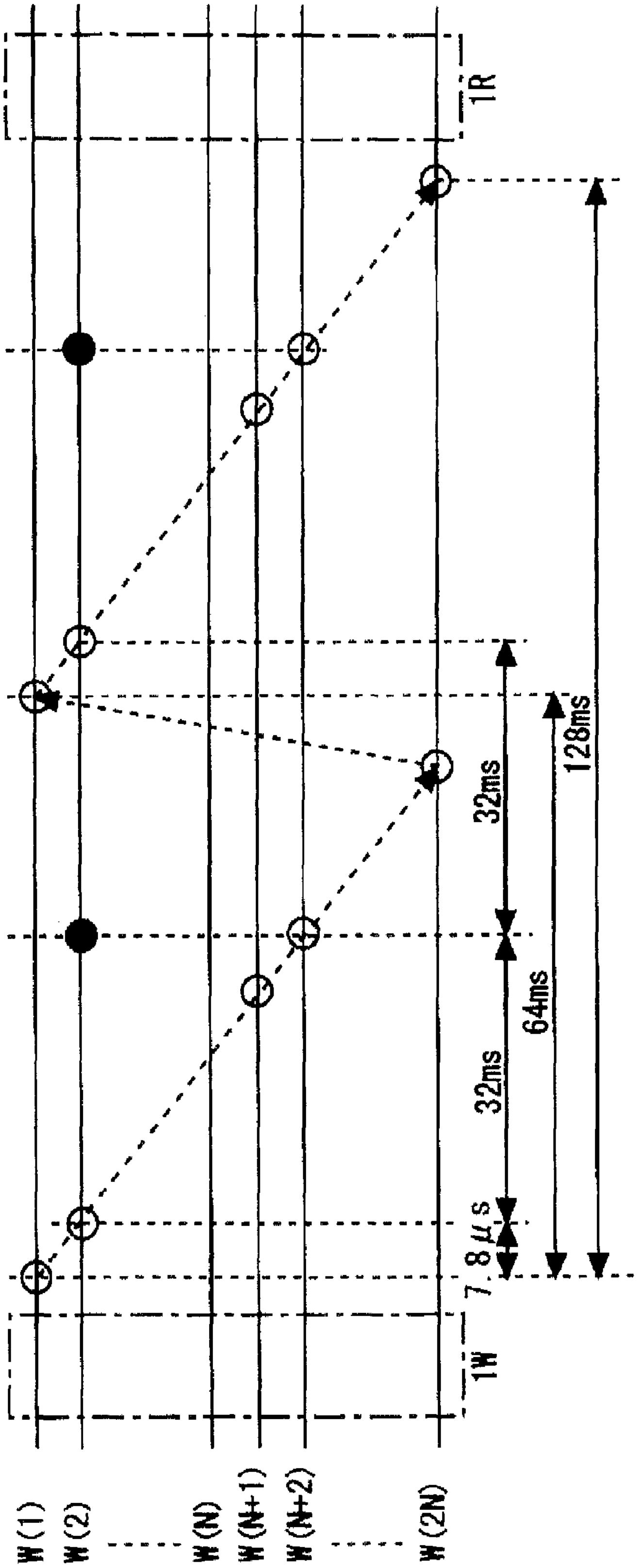
FIG. 7 is a diagram illustrating the refresh operation for test time according to yet another Comparative Example.
Figure 8:
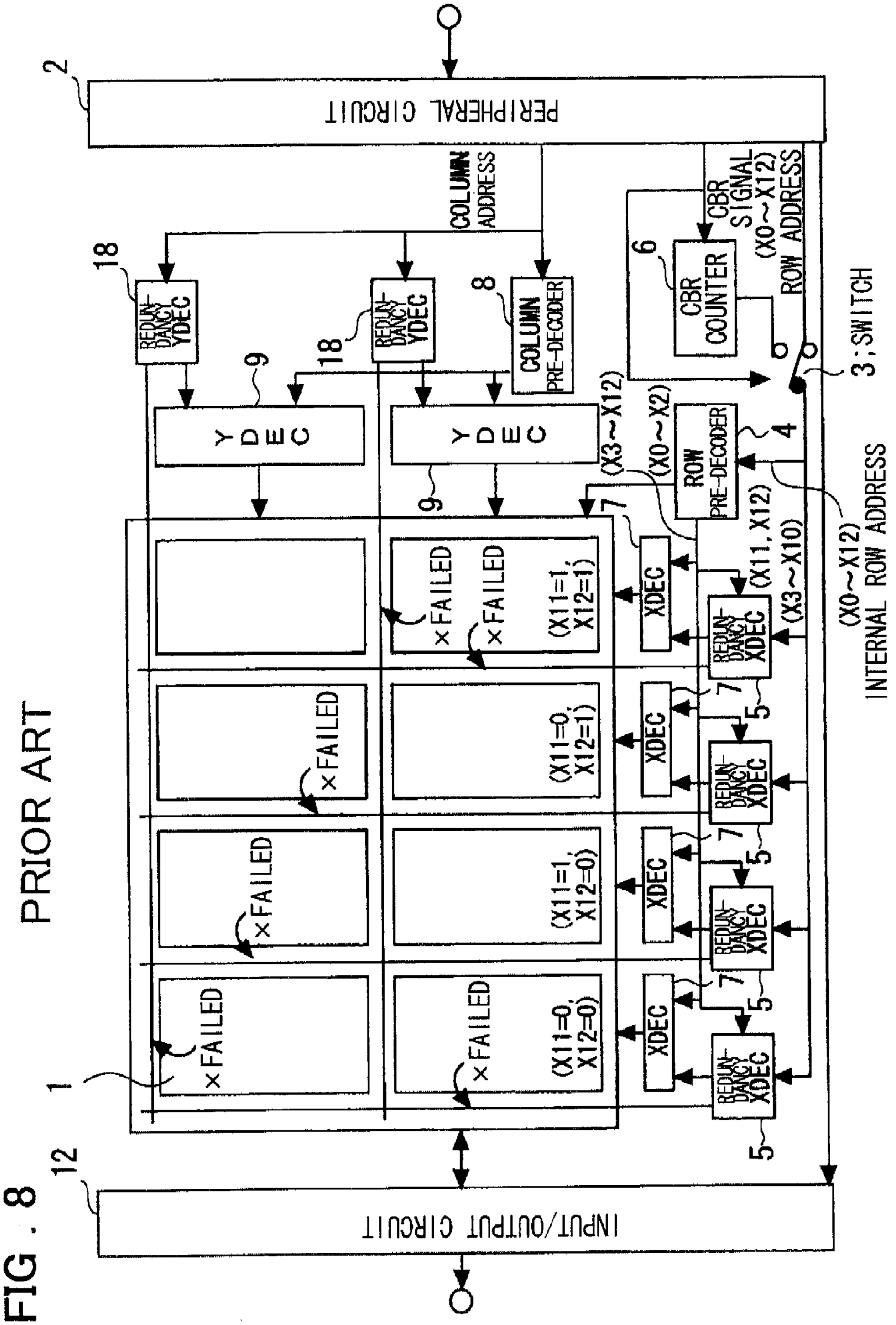
FIG. 8 is a diagram showing the configuration of a conventional semiconductor memory device.

FIG. 7 shows, by way of yet another Comparative Example of the present invention, the operation in a write-1-refresh-read-1 test, in which refresh similar to that shown in FIG. 3 is carried out after 1-write. In this case, 64 ms is taken for refresh of W(1) to W(2N). The word line W(2) is refreshed every 32 ms, and 128 ms is taken for refresh, thus increasing the test time. In mass production tests, in particular, increase in test time means increasing test costs, which is reflected in increasing product costs.

Conversely, with the present invention, test time may be shorter as the refresh period for the refresh fail cells is set to an optimum time interval, and the refresh period for the normal cells is also set to an optimum value, as shown in FIG. 4.

The above-described embodiment is directed to a case where the ROW is divided into two segments. However, the ROW may, of course, be divided into four segments. In case the ROW is divided into two segments, the word line W(2) is refreshed with the refreshing of the word line W(N+2). In the case of dividing the ROW into four segments, namely the segments of W(1) to W(N), W(N+1) to W(2N), W(2N+1) to W(3N), W(3N+1) to W(4N), the word line W(2) including the fail cell or cells may be refreshed simultaneously with the word lines W(N+2), W(2N+2) and W(3N+2), each including the normal cells.

Although the present invention has so far been described with reference to the drawings, it is to be noted that the present invention is not limited to the configuration of the above embodiments and may encompass various changes or corrections that may readily occur to those skilled in the art within the scope of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:

a plurality of cells in need of refreshing for data retention;

a control circuit that exercises control so that when a refresh command to a memory cell at a first refresh address is issued, refreshing is exercised to a memory cell at a second refresh address if the second refresh address corresponds to a fail cell and is different from the first refresh address by a value of a predetermined address bit, and an address retention memory that remains addresses of fail cells, wherein said address retention memory issues a control signal at a logic level determined in accordance with a comparison of the predetermined address bit value between a first refresh address and a fail cell address retained by said address retention memory; and a memory cell at the address of the fail cell is selected as the second refresh address for refreshing when said control signal is at a first logic level.

2. A semiconductor memory device comprising:

a plurality of cells in need of refreshing for data retention; and a control circuit that exercises control so that when a refresh command to a memory cell at a first refresh address is issued, refreshing is exercised to a memory cell at a second refresh address if the second refresh address corresponds to a fail cell and is different from the first refresh address by a value of a predetermined address bit, the memory cells at the first and second refresh addresses are refreshed when a first control signal received at said control circuit is at a first logic level and a refresh command is issued to the memory cell of the first refresh address, and only the memory cell of the second refresh address is refreshed when the first control signal is at a second logic level and a refresh command is issued to the memory cell of the first refresh address.

3. The semiconductor memory device according to claim 1, wherein said first and second refresh addresses are ROW addresses.

4. A semiconductor memory device comprising:

plurality of cells in need of refreshing for data retention; and a control circuit that exercises control so that when a refresh command to a memory cell at a first refresh address is issued, refreshing is exercised to a memory cell at a second refresh address if the second refresh address corresponds to a fail cell and is different from the first refresh address by a value of a predetermined address bit;

a counter that generates refresh addresses;

an address retention memory that retains addresses of fail cells; and an address decoder;

wherein said address retention memory issues a control signal at a logic level determined in accordance with a comparison of the predetermined address bit value between the first refresh address generated by said counter and a fail cell address retained by said address retention memory; and said address decoder selects a memory cell at the address of the fail cell as the second refresh address for refreshing when said control signal is at a first logic level.

5. The semiconductor memory device according to claim 4, wherein said address decoder selects only the memory cell at the first refresh address for refreshing; when said control signal is at a second logic level.

6. The semiconductor memory device according to claim 4, wherein said first refresh address is different from said fail cell address as to the value of the most significant bit.

7. The semiconductor memory device according to claim 4, wherein said predetermined address bit comprises one or more bits except for the most significant.

8. The semiconductor memory device according to claim 1, wherein the refresh command is issued every refresh period, and the refresh period of a normal cell is different from the refresh period of the fail cell.

9. The semiconductor memory device according to claim 8, wherein the refresh period for the normal cell is two times longer than the refresh period for the fail cell.

10. A semiconductor memory device comprising:

a plurality of cells in need of refreshing for data retention; and a control circuit that exercises control so that when a refresh command to a memory cell at a first refresh address is issued, refreshing is exercised to a memory cell at a second refresh address if the second refresh address corresponds to a fail cell and is different from the first refresh address by a value of a predetermined address bit, wherein the control circuit further exercises refreshing of the memory cell of the first refresh address in parallel to the refreshing of the memory cell of the second refresh address in response to the refresh command.

11. The semiconductor memory device according to claim 10, wherein the control circuit exercises a first refresh operation in which the memory cells at the first refresh address and the second refresh address are refreshed in response to the refresh command, and a second refresh operation in which the memory cell the second refresh address is refreshed without refreshing the memory cell of the first refresh address in response to the refresh command.

12. The semiconductor memory device according to claim 1, wherein when refreshing is exercised to the memory cell at the first refresh address and the memory cell at the second refresh address, the memory cells at the first refresh address and the second refresh address are refreshed simultaneously.

13. The semiconductor memory device according to claim 2, wherein when memory cells at the first and second refresh addresses are refreshed, the memory cells at the first refresh address and the second refresh address are refreshed simultaneously.

14. The semiconductor memory device according to claim 4, wherein when refreshing is exercised to the memory cell at the first refresh address and the memory cell at the second refresh address, the memory cells at the first refresh address and the second refresh address are refreshed simultaneously.

15. The semiconductor memory device according to claim 10, wherein when refreshing is exercised to the memory cell at the first refresh address and the memory cell at the second refresh address, the memory cells at the first refresh address and the second refresh address are refreshed simultaneously.

16. A semiconductor memory device comprising:

a plurality of cells in need of refreshing for data retention; and a control circuit that exercises control in such a manner that, when a refresh command to a memory cell at a first refresh address which includes a plurality of bits is issued, refreshing is exercised to a memory cell at a second refresh address which includes a plurality of bits and which is different from the first refresh address if at least one of the plurality of bits of the first refresh address is different from at least an associated one of the plurality of bits of the second refresh address, and remaining bits of the plurality of bits of the first and second refresh addresses are the same as each other, and refreshing is not exercised to the memory cell at the second refresh address if the at least one of the plurality of bits of the first refresh address is different from at least the associated one of the plurality of bits of the second refresh address and at least one of the remaining bits of the plurality of bits of the first refresh address is different from at least one of the remaining bits of the plurality of bits of the second refresh address.

* * * * *

UNITED STATES PATENT AND TRADEMARK OFFICE

CERTIFICATE OF CORRECTION

PATENT NO. : 7,688,655 B2
APPLICATION NO. : 11/747552
DATED : March 30, 2010
INVENTOR(S) : Yasuhiro Takai It is certified that error appears in the above-identified patent and that said Letters Patent is hereby corrected as shown below:

Column 9, Line 61, delete "that remains" and insert --that retains--

Column 10, Line 60, delete "significant." and insert --significant bit.--

Signed and Sealed this

Ninth Day of November, 2010

David J. Kappos
*Director of the United States Patent and Trademark Office*